(12) United States Patent
Murphy

(10) Patent No.: US 11,754,633 B1
(45) Date of Patent: Sep. 12, 2023

(54) ENERGY STORAGE CONTROL

(71) Applicant: Lunar Energy, Inc., Mountain View, CA (US)

(72) Inventor: Conrad Xavier Murphy, Piedmont, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 17/964,575

(22) Filed: Oct. 12, 2022

(51) Int. Cl.
*G01R 31/3835* (2019.01)
*G01R 31/367* (2019.01)
*H02J 7/00* (2006.01)

(52) U.S. Cl.
CPC ....... *G01R 31/3835* (2019.01); *G01R 31/367* (2019.01); *H02J 7/005* (2020.01); *H02J 7/00712* (2020.01)

(58) Field of Classification Search
None
See application file for complete search history.

(56) References Cited

U.S. PATENT DOCUMENTS

2008/0114499 A1  5/2008  Hakim et al.
2012/0150709 A1*  6/2012  Kaji ..................... G06Q 40/00
                                                                     705/35

\* cited by examiner

*Primary Examiner* — Jas A Sanghera
(74) *Attorney, Agent, or Firm* — Van Pelt, Yi & James LLP

(57) ABSTRACT

Determining an energy storage device plan includes determining a benefit gradient associated with charging or discharging of an energy storage. It further includes determining, using an energy storage lifetime model, a cost gradient associated with a degradation of the energy storage due to charging or discharging. It further includes applying a threshold to the benefit gradient and the cost gradient. It further includes facilitating charging or discharging of the energy storage based at least in part on the threshold being met or exceeded.

16 Claims, 3 Drawing Sheets

ENERGY STORAGE CONTROL

BACKGROUND OF THE INVENTION

Typically, configurations of energy storage systems, such as limits on SoC (State of Charge), are conservatively set to protect the energy storage. This may limit the utilization of the capabilities of such energy storage systems.

BRIEF DESCRIPTION OF THE DRAWINGS

Various embodiments of the invention are disclosed in the following detailed description and the accompanying drawings.

DETAILED DESCRIPTION

Figure 1:
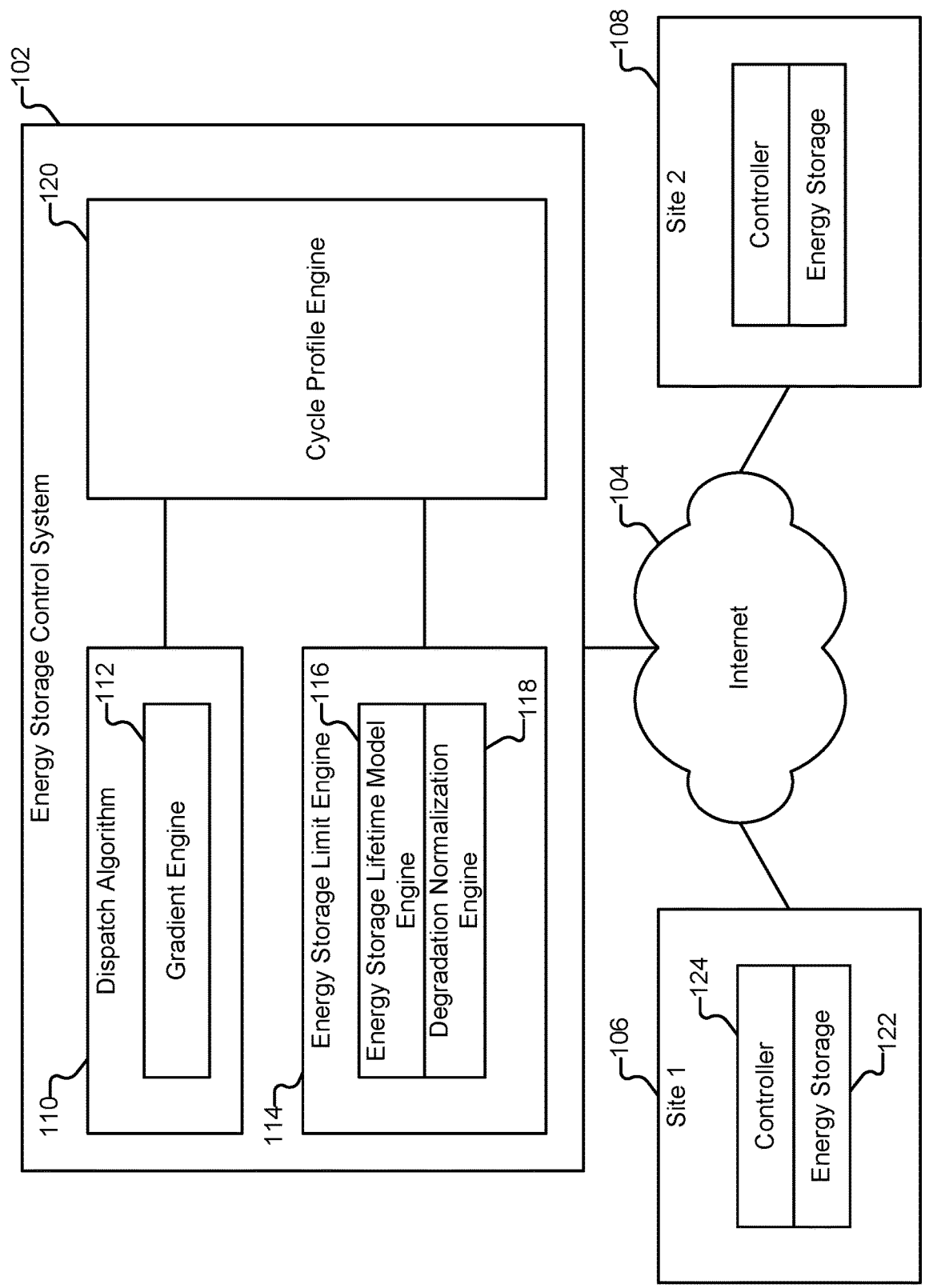
FIG. 1 illustrates an embodiment of a system for energy storage control.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Described herein are embodiments of energy storage control. Typically, in existing energy storage systems, such as battery storage systems, in order to protect the lifetime of the battery storage system, strict limits on the usage of the battery storage are put in place (e.g., minimum allowed SoCs, maximum allowed power draws, etc., in order to minimize the degradation in storage capacity over the course of many cycles over time). This conservative approach may unduly limit the capabilities of the battery storage system, preventing owners of such systems from maximizing or optimizing the benefit of their energy storage. Using embodiments of the energy storage control techniques described herein, the full range of the lifetime of an energy storage system may be accessed, allowing the utility of an energy storage system to be maximized.

An energy storage system, such as a battery storage system used in conjunction with a solar array installation (e.g., installed at a site such as a residential or commercial site), will last for a relatively long period of time (e.g., 20 years) if it is treated gently. However, there may be situations in which certain types of events are desired that go beyond the typical limits placed on the usage of the battery storage. For example, when there is a dynamic cost of energy, it may be desirable to treat the battery more harshly. Using the techniques described herein, separate operating conditions and modes may be dynamically implemented given the dynamically changing cost of energy. For example, using embodiments of the energy storage control techniques described herein, the operating conditions may be dynamically adjusted to allow for charging/discharging events (also referred to herein as cycle events) that otherwise might not be allowed in typical energy storage systems that have fixed limits. For example, using the techniques described herein, the power that the energy storage system operates over may be dynamically extended, the operating range of the state of charge may be dynamically extended, the peak current over a timescale (e.g., over a one second timescale) may be dynamically extended, etc. to facilitate, for example, starting an air conditioner, charging an electric vehicle, etc.

While embodiments involving battery storage systems are described herein for illustrative purposes, the energy storage control techniques described herein may be variously adapted to accommodate any other types of energy storage devices as applicable, such as fuel cell-based energy storage systems.

Embodiments of the energy storage control techniques described herein facilitate optimization of utilization of energy storage devices (e.g., discharging and/or charging) for different operating modes. For example, using the techniques described herein, when the cost of energy is dynamically varying, how valuable an individual cycle is (of charging or discharging the battery) is determined, where the value or benefit of the individual cycle is compared against the cost of the individual cycle (e.g., with respect to reducing the lifetime capacity of the energy storage) in order to dynamically and flexibly determine, on a per-cycle basis, how to control the battery storage. Using the techniques described herein, candidate cycle events are evaluated dynamically and on an individual basis, rather than having strict, one-size fits all operating rules that are uniformly and broadly applied to all cycles, as is the case with existing energy storage systems.

For example, in existing power systems, to protect the lifetime of the battery storage, relatively strict and conservative limits are placed on the manner in which the battery system is permitted to be cycled in order to minimize degradation in battery capacity. These limits are typically relatively conservative with a wide margin of buffer in order to prevent damage to the battery storage (e.g., reduction in overall storage capacity over time). For example, many existing energy storage systems do not allow the amount of energy storage in a battery (e.g., state of charge (SoC)) to fall below a threshold or minimum allowed SoC, such as 30%. While such limits may be helpful in preserving the life of the battery storage, they may be overly conservative and restrictive, and may make the system appear to be less capable than it actually is. For example, if the state of charge of the battery is never allowed to fall below 30%, then this means that the owner, on a day-to-day basis, is only practicably able to utilize 70% of the energy storage they have purchased.

Embodiments of the energy storage control techniques allow for more flexible decisions on how to control the energy storage system, allowing the capabilities of battery systems to be more fully utilized, rather than being unduly limited. For example, using the techniques described herein, in situations or scenarios where there is a dynamic cost of energy (e.g., where there are dynamic costs per kWh associated with wholesale energy prices, demand response programs, etc.), a power control scheme may be prescribed in which hard or stricter limits are removed, and where the full (or more of the) electrical capability of cells is allowed to be utilized. As will be described in further detail below, in some embodiments, the utilization of the battery cells in a cycle (e.g., charging or discharging of the battery storage for a certain period of time at a certain power level) is determined according to a comparison between the benefit or value of a cycle versus a cost of the cycle (e.g., cost in terms of impact or degradation on lifetime of the battery storage if the cycle were to occur). In this way, for a given cycle, a determination is made whether to use more or less of a cell's capability, where the determination is based on a determination of the value of the cycle (e.g., the benefit or value of the energy being provided in the given cycle), compared to an impact on the lifetime of the battery storage system. For example, if a cycle under consideration has a moderate benefit compared to a determined negative impact of degradation on the life of the battery storage, then the system determines that for this cycle, the cell's capability should be limited (and a cycle with such parameters is not optimal). On the other hand, if the benefit of allowing the battery to discharge to a lower SoC is much greater than the degradation caused by discharging to that lower SoC, then the battery storage is allowed to discharge to the lower SoC value.

In this way, using the energy storage control techniques described herein, limits on the usage of the battery are dynamically and intelligently applied across the various use cases in which the battery storage system is involved.

In various embodiments of the energy storage control techniques described herein, rather than cycle limits that are broadly or generally applied to all cycles, cycle-by-cycle decisions are made (dynamically) as to the benefit of the cycle (e.g., to the user, which may vary over time) versus the impact of the cycle (e.g., the impact on the lifetime of the battery storage), where the cost and benefit are normalized to a common unit or canonical format so that they may be directly compared. For example, if the cycle is valuable to the user (e.g., high economic benefit at the moment) and exceeds the impact of the cycle on the lifetime of the battery storage (e.g., opportunity cost of lost capacity over the remaining life of the battery storage system), then the control system allows for more energy to be provided during the cycle (e.g., because the benefit of the cycle being evaluated at this time exceeds the cost of the cycle by a threshold ratio).

In some embodiments, performing energy storage control includes taking an output of a site-level optimization. In some embodiments, the output of the site-level optimization indicates not only a plan or instruction for charging/discharging the battery storage, but also a benefit (which may be economic, where the economic benefit may dynamically vary at different points in time) from using the battery according to the plan/instruction. For example, if the value of energy provided by a cycle is particularly valuable for the period of time of interest, then even if the state of charge of the energy system is currently relatively low (e.g., close to 30%), the control system determines that the state of charge should be allowed to go even lower, as the user would derive a benefit that is much larger than the negative impact on the life of the battery storage.

For example, if in situations or scenarios where there is a dynamic cost of energy, rather having a hard floor of the state of charge of the battery system being 30%, there is a soft or variable limit that is determined according to an optimization of a cost function, which is based on the value of the cycle versus the damage that may be caused to the battery's life by lowering the state of charge.

FIG. 1 illustrates an embodiment of a system for energy storage control. In this example, energy storage control system 102 is implemented as a backend service hosted on a cloud infrastructure (such as Amazon AWS or Google Cloud). In this example, the energy storage system 102 is connected via network 104 (e.g., the Internet) to energy storage systems at numerous sites (e.g., sites 106 and 108). For example, sites 106 and 108 are residential sites (homes) that have installed power systems that include solar panel arrays and battery storage. For example, residential site 106 includes energy storage 122. In this example, these systems are also connected to the grid, where the homes not only import energy from the grid, but the power systems may also export energy to the grid (e.g., by providing solar energy to the grid and/or discharging energy from the battery storage to the grid). In some embodiments, the distribution of power at the site between the various power sources (photovoltaic (PV) array, energy storage, and grid) is managed by a controller (e.g., controller 124 of site 106).

In some embodiments, the energy storage control system 102 is configured to determine, for each site, an optimal energy storage control plan that is tailored or specific to a given site, where, for example, the control plan for an energy storage system includes a set of cycle instructions that specify a profile of how an energy storage system is to be cycled. For example, a cycle profile includes instructions to, at a particular time, discharge or charge the energy storage at a specified power level for a specified duration of time. The energy storage control system then sends the generated energy storage control plans to the respective sites, where the energy storage at a given site is controlled according to the corresponding energy storage control plan determined for that site. Energy storage control plans may be continuously generated by the energy storage control system for a given site over time to account for various changes in conditions at a site.

In this example, the control system includes two optimization algorithms that are linked and used together. In some embodiments, the two optimization algorithms are optimized dynamically (e.g., on a cycle-by-cycle basis), rather than being optimized once for the lifetime of the site. The following is an example of generating a control plan for controlling the energy storage of site 106. The energy storage control system 102 also generates control plans for site 108 (which may have a different control plan based on different optimization criteria).

In this example, the first algorithm is a dispatch algorithm 110 of the asset (e.g., battery storage device), which is configured to determine whether the energy storage system should be charging or discharging. In some embodiments, the algorithm is configured to perform an optimization based on programs that the site is involved in, such as tariffs, virtual power plant programs, time of use rate plans, or other economic programs. As one example, the dispatch algorithm determines an amount of compensation that would be earned if the battery were charged or discharged during a certain time period (e.g., between a certain set of hours).

In some embodiments, as part of performing the dispatch optimization, a set of shadow costs is determined. In some embodiments, the shadow costs are a gradient of how much more compensation would be earned if the battery were cycled in various ways (e.g., charged or discharged more or less during a period of time). This provides a measure of the benefit of various different types of cycles with different cycle parameters. As one example, the shadow cost gradient matrix is a Jacobian matrix. In some embodiments, the gradient matrix is determined using gradient engine 112.

In some embodiments, in addition to performing the optimization of the dispatch algorithm, the shadow costs or gradients are also evaluated. For example, if it is determined that the gradient is high, and it is a point in time where it is valuable to be performing more charging/discharging, then such information is fed to a second, lower-level algorithm (energy storage limit engine 114), which applies the limits on the battery (e.g., for cycling the battery). For example, if it is determined that the benefit to the site owner is high, then the behavior of the battery is opened up (e.g., the operating envelope or limits of the battery are permitted to be expanded for a period of time), allowing, for example, cycle profiles that specify charging to a higher voltage, discharging to a lower voltage, charging at a higher power (than would typically be allowed with existing systems), etc. Such an evaluation of the expansion of the power envelope is evaluated for both energy and power, effectively making the energy storage larger and more capable for those hours (where there may be a high benefit). As shown in this example, rather than filtering out cycles according to a one-size fits all set of cycle limits, the limits on how the battery storage device may be cycled are broadened to allow for larger operating ranges than would typically be allowed in existing systems with fixed cycle limits.

In some embodiments, a tradeoff (e.g., economic tradeoff) is made, where the economic benefit of a cycle (e.g., according to dispatch algorithm optimization and shadow cost gradients) is traded off against the lifetime of the battery, which may be negatively impacted by cycling (cost for the cycle). If the benefit of performing a cycle (with a given set of parameters) at the time period of interest or consideration is high relative to the cost of performing the cycle, then the cycle may be performed. The benefits may change dynamically over time, and the same type of cycle may not be as beneficial at another point in time (and would not be optimal given the degradation cost).

For example, energy storage lifetime model engine 116 is configured to determine, according to a battery or energy storage lifetime model, an amount of damage to the lifetime of the battery were a given cycle (with a corresponding set of cycle parameters) performed. For example, the energy storage lifetime engine is configured to estimate, predict, forecast, or otherwise determine, using the model, that if the battery is charged at one rate versus another, an amount of damage that would occur to the cell. For example, the lifetime engine is configured to determine an amount of capacity that will be removed from the battery for the rest of its life if a cycle (with a certain set of parameters) were performed. While this may be a relatively small amount of battery capacity lost, this damage will accumulate over cycling over the course of the remaining life of the battery (e.g., 20 years of cycling).

The damage or cost of the loss in capacity for the remainder of the life of the battery storage may be normalized to a unit that is the same as the benefit, allowing direct comparison of the benefit of a cycle to its degradation cost. As one example, the energy storage control system determines that the battery typically earns $2 each time it cycles. However, for today, the battery can be cycled in a manner that results in a benefit of $100, but at the cost of increased damage that amounts to 0.1% less energy for the rest of the battery's life. This results in a lower benefit curve over the remainder of the life of the battery. As one example, the energy storage control system determines that the battery is a nominal 10 kWh, typically cycles 250 times per year and earns $0.20 each kWh it cycles. If there are 10 years left in the battery's lifetime, it is expected that the battery is worth $5,000 (ignoring discount rates). On a certain day, each kWh may be worth $5.00/kWh. If 11 kWh is cycled on that day by charging to a higher voltage, then a model is determined of how much damage/lost capacity that will cause.

In some embodiments, a discount cashflow model is then used. For example, suppose that while cycling the battery in a particular manner will earn more economic compensation, it will also result in some estimated amount of degradation in the life of the battery. In some embodiments, the amount of degradation is normalized into the same form/units as the benefit. For example, the amount of degradation is translated into a predicted lost amount of future compensation earned over the rest of the life of the battery. In the example of FIG. 1, the normalization of the estimated degradation to a cost that is in the same unit as the benefit is performed by degradation normalization engine 118. The normalization allows the benefit of a cycle with a given profile to be directly compared with the cost of that cycle.

As one example of performing the normalization, the average value of a cycle is determined. The loss in energy capacity is a loss in the amount of energy that can, for example, be discharged (and, for example, exported to the grid) during a cycle. This in turn translates to a loss in the average value of a cycle. Over the remainder of the life of the battery, an expected number of remaining cycles is determined. The loss in value aggregated across the remaining cycles is determined. This results in an economic representation of the cost of degradation in battery capacity due to performing a cycle in a particular manner, which can then be compared with the benefit of performing that cycle.

In some embodiments, cycle profile engine 120 is configured to perform an analysis of candidate cycles that includes a comparison of the benefit of a given cycle with a particular specified cycle profile, against the cost of performing the cycle. In some embodiments, the tradeoff is compared against a threshold that is used to determine whether that cycle should be performed. For example, the cycle with a profile that maximizes benefit compared to degradation cost is selected, where the battery storage device at the site is instructed to perform the cycle according to the selected cycle parameters.

As shown in the above example, the manner in which a cycle of the battery storage is executed is controlled via specification of a set of cycle parameters, which define a cycle profile for the cycle. The set of cycle parameters includes configurable parameters pertaining to a type of cycle event (e.g., charge or discharge), a max or min allowed state of charge (SoC) level, a power at which the cycle event is performed, and an amount or duration of time that the cycle event is performed for. In various embodiments, cycle parameters include a voltage to which the energy storage is charged up to, a voltage to which the energy storage is discharged, a power at which the energy storage is charged, a power at which the energy storage is discharged, an amount of time at which the energy storage is charged or discharged to a certain power level, etc. For a cycle with a set of cycle parameters, the economic benefit derived from performing such a cycle is compared against an estimated damage to the energy storage system if such a cycle were performed.

Further embodiments of energy storage control on a per-cycle basis are described below.

The following is an example of selecting or determining a cycle profile for charging or discharging an energy storage. In some embodiments, as described above, the dispatch algorithm is configured to perform an economic optimization, the result of which is an output that includes a schedule that indicates when to charge or discharge an energy storage, and at what rate (power). As part of the performing the optimization, which includes performing various linear algebra, a matrix of gradients is also determined, where the matrix of gradients is also referred to as a "shadow cost matrix," where the items in the shadow cost matrix represent the shadow cost of various decisions. The shadow cost matrix indicates the amount of value from charging or discharging at a certain time. In some embodiments, the shadow cost gradient matrix is a Jacobian matrix. For example, the dispatch algorithm provides as output a cycle profile that minimizes an objective function, where the shadow cost matrix indicates that if the parameters of the profile of the cycle are perturbed in various directions (e.g., with respect to changing the duration of the cycle, changing SoC limits of the cycle, changing power level of the cycle, etc.), the amount of additional compensation earned, or the amount of compensation that would be lost. In some embodiments, the dispatch algorithm has an objective function, and the lifetime value of the battery is included, as generated by the cycle profile engine, in that function. As one example, a variety of inputs is sampled, and the highest value (or value that minimizes an objective function) is selected.

By knowing such gradients or slopes, the economic impact or importance of varying cycle profile parameters (e.g., charging or discharging at a higher power, charging or discharging a certain amount of additional energy) is determined. Such information is then used in determining how to optimize the usage of the lifetime of the battery.

For example, another model (e.g., energy storage lifetime model engine 116) is executed that indicates, in order for the battery to achieve a target lifetime (or have as long a lifetime as possible), an SoC range to be used, and what power the battery storage should be allowed to operate over (e.g., charge or discharge at). In existing systems, the limits on the battery usage (SoC range and power that the battery storage is allowed to operate over) do not take into account economic factors or the value of executing a cycle with a certain profile. In existing control systems, an assumption is made that every cycle is equally valuable. However, in reality, this is not the case, as some cycles may be more valuable (e.g., from a compensation benefit standpoint) than others by several orders of magnitude, where the benefit may vary dynamically and unpredictably over time.

It would be beneficial to know which cycles are more valuable, as this allows for a determination of whether a tradeoff should be made with the degradation impact of the cycle.

In the example of FIG. 1, the cycle profile engine is configured to take as input the aforementioned shadow costs, which indicate how much additional compensation would be received if the battery were further stressed (e.g., charged or discharged more and/or at a higher power level). When the benefit is high, the cycle profile engine allows a greater range of battery capabilities to be used for that cycle.

In some embodiments, to ensure that there is not simply a heuristic, a battery lifetime value model is utilized that normalizes the degradation impact into a unit that is comparable with the economic benefit (e.g., in dollars and cents). The following is an example of converting or normalizing a degradation impact from one form to another. In this example, a loss in storage capacity (example of degradation impact of energy storage) is converted into an economic cost. In some embodiments, an average cycle is associated with an estimated value (e.g., 10 cents per kilowatt-hour cycled). The damage of a given cycle is determined, according to the battery lifetime model, as an amount of capacity lost for the remaining cycles, after the given cycle is performed. For example, suppose that it is determined that performing a given cycle will result in a lifetime trajectory for the battery storage in which it will have 0.1% less capacity for the next 1,000 cycles. Each of those future cycles is assumed to be an average cycle, which is, for example, 0.1 cents.

The benefit of the given cycle is compared to the expected cost of the additional damage to the energy storage were the given cycle performed. For example, it may be that one cycle allows for 5% more energy to be obtained, but that energy is 1,000 times more valuable, because the shadow cost is high. In some embodiments, the cycle profile engine, based on the comparison of the shadow cost to the normalized damage cost, determines whether the cycle should be performed. In some embodiments, the cycle profile selection algorithm is discounted, in order, for example, to prevent overfitting to the model or predictions due to noise. For example, if the ratio of the benefit of the cycle to the cost of the cycle is below a threshold (e.g., less than a factor of two, or any other threshold, as appropriate), then the more stressful cycle is not performed, and a more conservative set of cycle profile defaults may be used instead. In this way, noise in the lifetime model is not inadvertently acted upon, and marginal decisions are prevented from being performed.

The following is an example of energy storage control. Suppose that a utility grid is currently highly stressed and sends out an alert. In this example, there is insufficient energy on the grid, and the utility is incentivizing users that have energy stored in their on-site batteries to discharge energy to the grid (e.g., in order to keep the grid in balance and prevent blackouts from occurring). Suppose that during this alert period, if a user discharges their energy storage between the hours of 5 pm-6 pm, and delivers that energy to the utility grid, they will be compensated at a rate of $5 per kilowatt-hour. Suppose that during typical operation (e.g., when the grid is not highly stressed), the user would be compensated 34 cents per kilowatt-hour. In this case, the cost of energy has dynamically changed, and the benefit of discharging a site's energy storage is relatively high compared to typical hours.

In this case, suppose that the shadow cost matrix indicates that the derivative or the slope is that each kilowatt-hour that can be sold during this alert period is $10 (that is, as part of the optimization, there is a matrix entry that it is $10 per kWh, at this point in time with the aforementioned incentivization). In some embodiments, an optimization is run that determines, for different cycle profiles (where, for example, the SoC range is increased, resulting in an effectively larger battery), the amount of additional compensation that would be received. If the shadow cost is high when the same optimization is run with, for example, a 5% larger battery, then this may be indicative that it may be worth trading off some battery degradation in order to derive the currently larger economic benefit. For example, when determining a shadow cost, a derivative is determined that indicates for different battery sizes (with greater amounts of energy able to be discharged or charged) the amount of economic compensation that can be achieved.

Here, the shadow cost matrix is used to determine how much more economic benefit would be received if the battery were effectively larger (by allowing more of its energy to be drawn). When that economic benefit is large, then the battery is allowed to be larger (e.g., exceed default limits when cycling). When performing the optimization, a first cycle profile is determined as an optimum. In some embodiments, the dispatch algorithm then tries adjusting the parameters of the cycle profile (e.g., charging or discharging by an additional amount during a certain period of time, and having a different window for the operating range of the battery storage given an expected lifetime), and determining how much more or less economic compensation is received. The optimization then reaches an optimum based on matrix slopes. The slopes are then used to determine the additional benefit of what would occur if the battery were larger (and allowed to charge or discharge more). As described above, in some embodiments, these slopes are the Jacobian shadow cost matrix.

The optimizations may be used to determine charging and discharging limits to maximize the amount of energy that can be obtained. If charging is performed at wider limits, more capacity is achieved, but this may result in more cell degradation (and being able to cycle for fewer times over the lifetime of the battery). Typically, in existing systems, such optimization is performed once at the beginning of the life of the energy storage, using an average value of a cycle.

For example, in existing systems, an optimum SoC limit is determined once, based on an average cost per cycle and a desired lifetime. As part of this optimization, different SoC limits (which have different lifetimes, where a battery with narrower SoC limits will have a longer lifetime, in which case more value may be realized assuming all cycles are equal) are evaluated. This results in a shadow cost matrix being generated that shows the expected value of having varying SoC limits for the battery. However, the benefits are typically generated based on an assumed average cycle cost.

Using the techniques described herein, rather than performing an optimization once in the lab to determine limits on the operation of the battery storage (and using an average cycle cost) that are then used for the remainder of the life of the battery storage, a real-time evaluation of the viability of a specific cycle is determined, which is then used in turn to determine whether to expand or contract the allowed SoC operating range of the energy storage and the available power. In this way, the operating range of the battery storage is not unduly bounded.

In this case, using embodiments of the techniques described herein, SoC limit optimization (optimization of the operating limits of the SoC or voltage) is determined in real-time, as opposed to once (as occurs with existing systems, as described above). This is based in part by having a dynamic measure of the economic value of a cycle, as opposed to having a fixed assumption of the economic value received each time the battery is cycled over its lifetime.

Using the techniques described herein, the SoC range for the battery is not fixed, but is dynamically re-evaluated to determine, for a given cycle, a new optimum SoC range or operating range for the battery.

In some embodiments, the cycle profile engine optimization is performed periodically (e.g., every hour).

The following is another example of performing the battery profile limit determination. An economic benefit of making the battery capacity larger is determined (e.g., the amount of additional dollars earned for each kilowatt hour that the battery's capacity is increased by—or allowed to charge up to or discharge down to).

A cost of allowing the battery to charge up or down to the wider limit is represented as an impact of having less energy stored for the rest of the battery's life. For example, suppose that the lifetime is 20 years for a battery. A determination is made during the $5^{th}$ year of operation, in which case there is 15 years of life remaining on the battery. The amount of damage caused by a cycle, if performed (and allowing the limits of the battery to be expanded), is determined. For example, for the next 15 years, a curve is determined of how many kilowatt hours of capacity the energy storage will have over the next 15 years. If the candidate cycle (e.g., charging or discharging the energy storage by some amount or percentage of a full cycle) is performed, that curve will be lowered (due to degradation effects, as described above). For example, if the candidate cycle is performed, and an additional kilowatt hour of energy is allowed to be used, then a new vector is generated. In some embodiments, the energy storage lifetime model engine outputs a vector representing the capacity of the battery available for each cycle. If the candidate cycle is performed, every future cycle will have less energy available.

In some embodiments, an estimate or assumption is made of how valuable cycles beyond the forecast window of the dispatch algorithm are (e.g., 10 cents per kilowatt hour). Computations are performed to determine the cost of the loss of energy storage capacity. For example, if the impact of the candidate cycle is to reduce the overall storage capacity of the battery by one watt hour (the amount of energy capacity lost due to the performance of the candidate cycle), then that one-watt hour is multiplied by the typical cycle cost (e.g., by 10 cents), which results in a cost of the energy lost. This calculation is accumulated, or integrated over, the remaining lifetime of the battery (e.g., over the expected number of cycles that will be performed over the estimated remaining life of the battery).

In some embodiments, a discount rate is also applied. In some embodiments, the discount rate mathematically weights an expected benefit (e.g., cashflow) so that benefit received today is more valuable than a benefit received in the future (e.g., in 10 years). The difference between the typical case and the lower energy storage capacity curve from allowing the candidate cycle (e.g., extra discharge) to be performed is the cost of performing the candidate cycle.

This cost is then compared against the benefit from the candidate cycle. For example, the ratio of the benefit over the cost is determined. If the ratio is greater than a threshold, then the candidate cycle (which has a profile that may exceed default limits) is allowed to occur (because the economic benefit of the candidate cycle greatly exceeds the cost in lost capacity due to performing the candidate cycle).

With the tradeoffs described above, more energy is obtained at a current point in time if the battery is allowed to utilize more of its capacity during cycles, but every future cycle will be smaller (due to degradation effects). In some embodiments, the lifetime battery model is used to determine, if a candidate cycle were performed, an amount of damage that would be inflicted on the battery cell, and that impact going forward. Every single cycle will have a lower amount of available energy than if the damage that was being contemplated (due to performing of the candidate cycle) was not done. This damage is summed up from the current time until the battery's predicted end of life to determine the cost of the candidate cycle.

In some embodiments, from a battery model perspective, an assumption is made that a certain number of cycles will occur each year. One example assumption is that, on average, a site will be performing 80% of a full cycle a day. For the longer term battery model, various use case assumptions, which include various average or aggregate values, are used. For example, an average cycle-value per kilowatt hour is used (e.g., on average, a cycle will be worth 10 cents a kilowatt hour). Another example assumption is that described above, which is the predicted percentage of a full cycle (e.g., full charge or discharge cycle) that will be performed on a daily basis (e.g., that, on average, it will be economic to do 80% of a cycle a day). In reality, on some days, full cycles may be performed, and other days, 50% cycles are performed (or no cycling at all because it would not be valuable or beneficial or optimal to do so).

In some embodiments, the battery lifetime model is used to determine, for every cycle, the amount of damage that occurs, where the amount of damage is accumulated. As described above, a given amount of damage shrinks the available energy in the battery storage. In some embodiments, the model has multiple terms, where in addition to being dependent on an amount of energy and a number of cycles, is also dependent on the power that cycling is performed at. For example, if energy storage is discharged at a two-hour rate (higher power) instead of a three hour rate, then there is more damage (e.g., the faster the energy storage is discharged during a cycle event, the more damage done to the cell). Performing more cycles causes more damage to the battery, and discharging at higher power also adds damage to the battery. In both cases, that damage translates to less energy and less battery capacity going forward. This is similar to predicting the impact on the battery if the SoC range were increased. Similar curves are evaluated to determine what occurs if the battery is charged at the same SoC range at higher power. The two can also be combined to determine what is the amount of capacity lost if the battery were to be charged at a higher power and a wider SoC range were allowed. The battery lifetime model is configured to calculate such damage based on such cycle parameters.

In some embodiments, the candidate cycle that maximizes the ratio between benefit and damage cost is selected. For example, suppose that the price of power will be high for the next three hours. One candidate cycle is to discharge during that entire three hours slowly, while another candidate cycle discharges the battery within a single hour. If the economic benefit of both cycles is the same, then discharging more slowly would have a lower cost (because of the lower power over which the cycle operates, reducing the amount of damage done to the battery), and thus the candidate cycle with the lower power profile is selected (as its benefit to cost ratio would be of a higher value).

In other cases, the utility may instead, for example, have a narrow time window for which it purchases electricity at a high rate. For example, there may be a one-hour window that is valuable. In that case, the optimization may determine that it is more beneficial to discharge as much energy from the battery to the grid as quickly as possible in that one hour window, and select a candidate cycle for execution that has a higher discharge power.

In some embodiments, the output of the optimization is a control plan, which includes a profile of a charge or discharge cycle. For example, the profile indicates, for a cycle, the power at which charging or discharging is to be performed at, and the duration of time that the discharging or charging occurs. As described above, in some embodiments, the candidate cycle with the highest cost to benefit ratio (where the ratio is also required in some embodiments to meet or exceed a threshold ratio) is chosen for execution at the battery storage. One example of a cycle profile is an instruction to discharge the battery storage at a certain power for a certain duration of time. In some embodiments, the optimization described above is repeated periodically, such as every hour, or any other frequency as appropriate.

A cycle execution profile is then transmitted from the energy storage control system to an on-premise battery site (e.g., to controller 124 of a power system installed at site 1 106). The controller includes a processor that is configured to charge or discharge an energy storage according to the received cycle profile plan (e.g., charge or discharge at the specified power for the specified amount of time).

Figure 2:
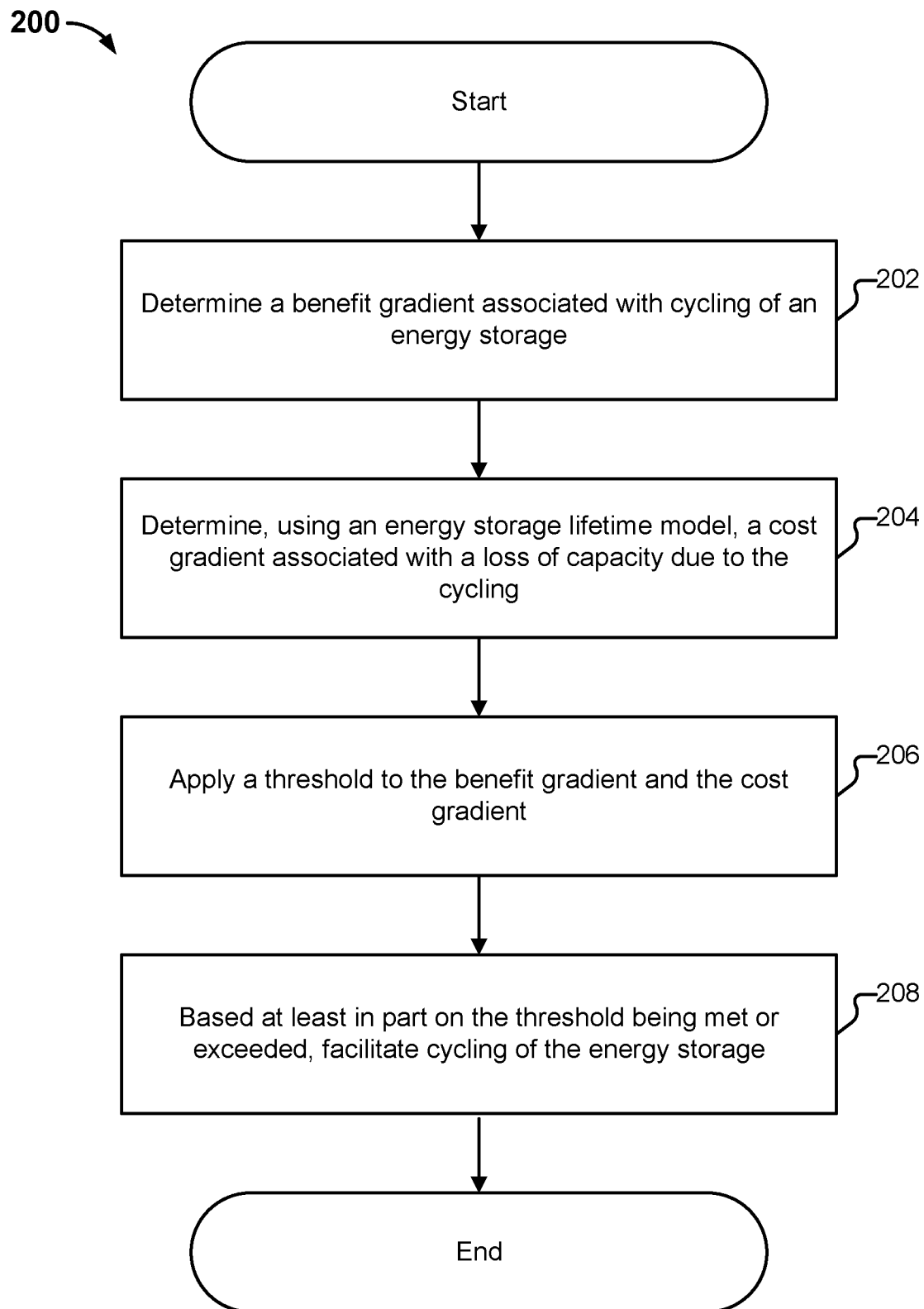
FIG. 2 is a flow diagram illustrating an embodiment of a process for determining an energy storage device control plan.

FIG. 2 is a flow diagram illustrating an embodiment of a process for determining an energy storage device control plan. In some embodiments, process 200 is executed by energy storage control system 102 of FIG. 1. The process begins at 202, when a benefit gradient associated with at least partial cycling (e.g., charging or discharging) of the energy storage is determined. At 204, a cost gradient associated with a loss of energy capacity due to the cycling is determined using an energy storage lifetime model. At 206, a threshold is applied to the benefit gradient and the cost gradient. At 208, cycling (charging or discharging) of the energy storage is facilitated based at least in part on the threshold being exceeded. In some embodiment process 200 is performed on a per-site basis. In some embodiments, process 200 is repeated periodically or performed on-demand (e.g., to account for benefits dynamically changing over time).

The following is an example of performing process 200. At 202, a benefit gradient associated with cycling (e.g., charging or discharging) of an energy storage is determined. As one example, a shadow cost of cycling an energy storage, were the energy storage to have various different operating parameters, is determined. The shadow cost is used to determine the benefit of performing candidate cycles (that charge or discharge the battery in different manners). This may be based on a net metering plan, a tariff, a time of use plan, etc. In some embodiments, a candidate cycle is associated with a corresponding set of cycle parameters, which include an amount of time for the cycle as well as a power at which the cycle is performed. An example of a cycle profile for an example 24 hour optimization period is a vector such as [0 0 0 0 0 0 1 1 1 1 1 1 0 0 0 0 0 0 −1 −1 −1 −1 −1 −1], representing an energy storage system that charges at 1 kW during hour 7-12 and discharges at 1 kW during hours 19-24. As one example, the optimization profile may have a shadow cost such as [0.2 0.2 0.2 0.2 0.2 0.1 0.1 0.1 0.1 0.1 0.1 0.3 0.3 0.3 0.3 0.3 0.3 0.4 0.4 0.4 0.4 0.4 0.4]. In this example, this means that every extra discharge kW in a candidate power profile is worth 20 cents in hour 1, 10 cents in hour 7, 30 cents in hour 13, and 40 cents in hour 19. Lower discharge powers (or higher charge powers) have costs with the opposite sign.

At 204, the impact on the energy storage capacity of the energy storage over the remainder of its expected life is determined. For example, a loss in capacity due to performing a given candidate cycle is determined. As one example, a lifetime energy storage model is queried to determine, given the profile of the candidate cycle (e.g., the amount of time of the candidate cycle and the power at which the candidate cycle would be performed), the expected damage or loss in capacity that the battery would suffer (e.g., the amount of kilowatt hours that the capacity of the energy storage would decrease by). The impact is normalized to be of a same unit as the economic benefit determined at 202. As one example, the predicted loss in capacity (measured in kilowatt-hours) is multiplied by an expected cost (e.g., average cost) of a typical cycle per kilowatt-hour. This cost is accumulated over the expected number of cycles that will be performed over the remaining life of the energy storage. The following is an example of a formula for determining such a cost. Suppose that "D" is the number of days left in the lifetime of the product, where, for example, this is the length of most vectors.

As one example, NPV (Net Present Value), Storage system=SUM(Lifetime Capacity Vector (kWh, D*1)*Average daily cycled energy value ($/kWh, D*1)*Discount rate vector (%, D*1).

In some embodiments, at 206, the ratio of the benefit of the candidate cycle to the cost of performing the candidate cycle is performed. At 208, if it is determined that the ratio meets or exceeds a threshold ratio (e.g., so that noise is ignored), then the energy storage is instructed to discharge or charge according to a profile of the candidate cycle. In some embodiments, various candidate cycles with various different cycling parameters are evaluated, and the candidate cycle with the highest ratio of benefit to cost, that also exceeds a threshold ratio, is selected and provided to the energy storage. For example, the cycle profile is transmitted or sent (e.g., over a network such as the Internet) as an instruction to a controller coupled to the energy storage, where the controller charges or discharges the energy storage according to the cycle profile.

Figure 3:
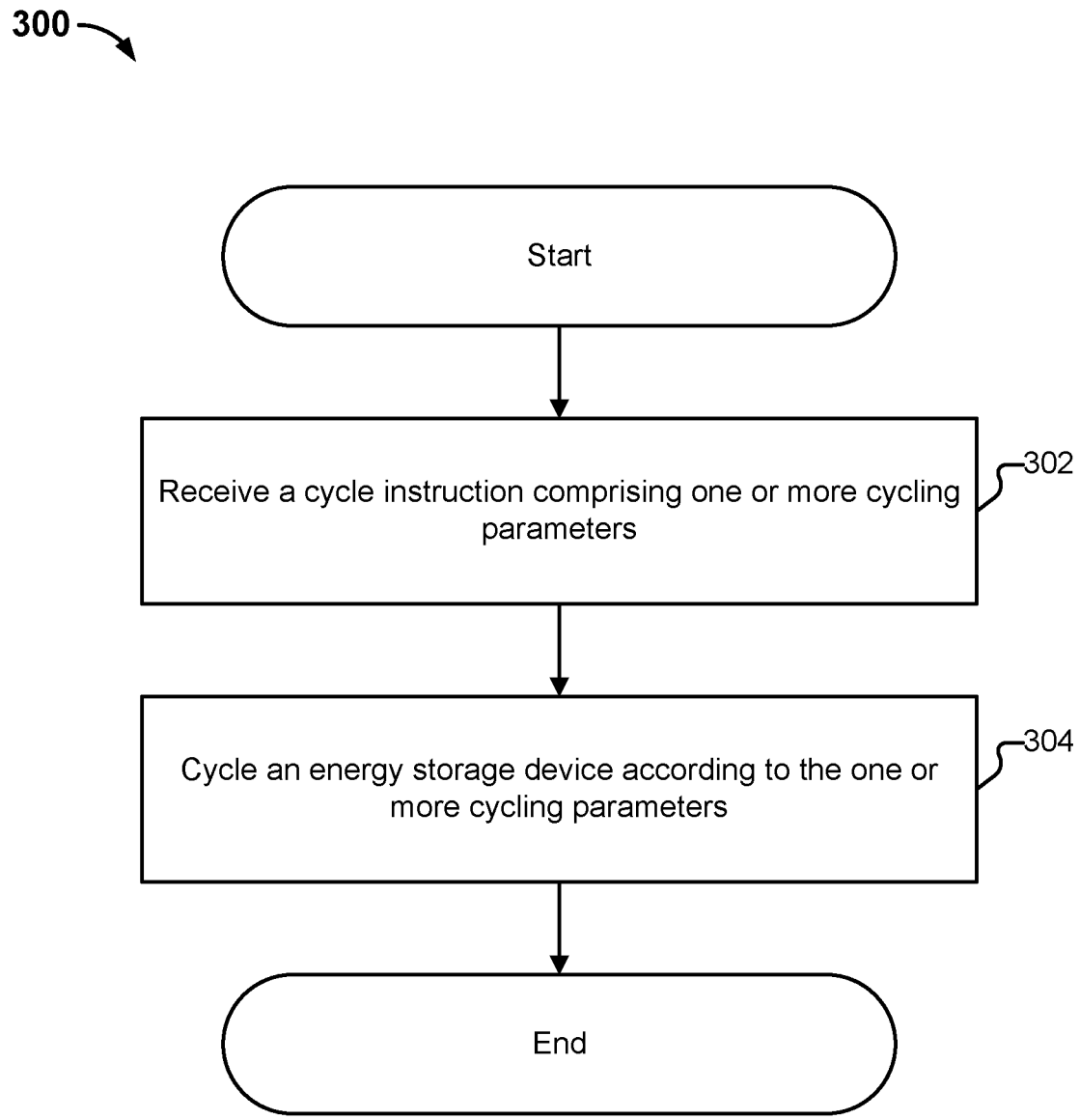
FIG. 3 is a flow diagram illustrating an embodiment of a process for controlling an energy storage device.

FIG. 3 is a flow diagram illustrating an embodiment of a process for controlling an energy storage device. In some embodiments, process 300 is executed by an energy storage controller such as controller 124 of FIG. 1. The process begins at 302 when a cycle instruction including one or more cycling parameters is received. For example, an energy storage cycle instruction is received from an entity such as energy storage control system 102. In some embodiments, the energy storage cycle instruction is generated using process 200 of FIG. 2. At 304, an energy storage device is cycled according to the one or more cycling parameters of the cycling instruction.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    determining a benefit gradient associated with discharging of an energy storage;
    determining, using an energy storage lifetime model, a cost gradient associated with degradation of the energy storage;
    applying a threshold to the benefit gradient and the cost gradient;
    facilitating discharging of the energy storage based at least in part on the threshold being met or exceeded; and
    facilitating charging of the energy storage at least in part by determining a benefit gradient associated with the charging of the energy storage.

2. The method of claim 1, wherein the degradation comprises a loss of capacity of the energy storage.

3. The method of claim 2, wherein the cost gradient is determined at least in part by determining a measure of lost cycles associated with the loss of capacity.

4. The method of claim 1, wherein the benefit gradient comprises a shadow cost matrix.

5. The method of claim 1, wherein facilitating the discharging of the energy storage comprises transmitting, over a network, a set of instructions for the discharging of the energy storage.

6. The method of claim 5, wherein the set of instructions comprises at least one of a rate of discharging or a duration of discharging.

7. A method, comprising:
    determining a benefit gradient associated with discharging of an energy storage;
    determining, using an energy storage lifetime model, a cost gradient associated with degradation of the energy storage;
    applying a threshold to the benefit gradient and the cost gradient;
    facilitating discharging of the energy storage based at least in part on the threshold being met or exceeded; and
    determining a second benefit gradient associated with discharging of the energy storage at a subsequent time.

8. A system, comprising:
    a processor configured to:
        determine a benefit gradient associated with discharging of an energy storage;
        determine, using an energy storage lifetime model, a cost gradient associated with degradation of the energy storage;
        apply a threshold to the benefit gradient and the cost gradient;
        facilitate discharging of the energy storage based at least in part on the threshold being met or exceeded; and
        facilitate charging of the energy storage at least in part by determining a benefit gradient associated with the charging of the energy storage; and
    a memory coupled to the processor and configured to provide the processor with instructions.

9. The system of claim 8, wherein the degradation comprises a loss of capacity of the energy storage.

10. The system of claim 9, wherein the cost gradient is determined at least in part by determining a measure of lost cycles associated with the loss of capacity.

11. The system of claim 8, wherein the benefit gradient comprises a shadow cost matrix.

12. The system of claim 8, wherein facilitating the discharging of the energy storage comprises transmitting, over a network, a set of instructions for the discharging of the energy storage.

13. The system of claim 12, wherein the set of instructions comprises at least one of a rate of discharging or a duration of discharging.

14. A system, comprising:
    a processor configured to:
        determine a benefit gradient associated with discharging of an energy storage;
        determine, using an energy storage lifetime model, a cost gradient associated with degradation of the energy storage;
        apply a threshold to the benefit gradient and the cost gradient;

facilitate discharging of the energy storage based at least in part on the threshold being met or exceeded; and determine a second benefit gradient associated with discharging of the energy storage at a subsequent time; and a memory coupled to the processor and configured to provide the processor with instructions.

15. A computer program product embodied in a non-transitory computer readable storage medium and comprising computer instructions for:

determining a benefit gradient associated with discharging of an energy storage;

determining, using an energy storage lifetime model, a cost gradient associated with degradation of the energy storage;

applying a threshold to the benefit gradient and the cost gradient;

facilitating discharging of the energy storage based at least in part on the threshold being met or exceeded; and facilitating charging of the energy storage at least in part by determining a benefit gradient associated with the charging of the energy storage.

16. A computer program product embodied in a non-transitory computer readable storage medium and comprising computer instructions for:

determining a benefit gradient associated with discharging of an energy storage;

determining, using an energy storage lifetime model, a cost gradient associated with degradation of the energy storage;

applying a threshold to the benefit gradient and the cost gradient;

facilitating discharging of the energy storage based at least in part on the threshold being met or exceeded; and determining a second benefit gradient associated with discharging of the energy storage at a subsequent time.

\* \* \* \* \*